(12) United States Patent
Nelson

(10) Patent No.: US 6,693,436 B1
(45) Date of Patent: Feb. 17, 2004

(54) METHOD AND APPARATUS FOR TESTING AN INTEGRATED CIRCUIT HAVING AN OUTPUT-TO-OUTPUT RELATIVE SIGNAL

(75) Inventor: Christopher J. Nelson, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/471,638

(22) Filed: Dec. 23, 1999

(51) Int. Cl.[7] .................. G01R 31/26; G01R 31/28; H03K 19/003
(52) U.S. Cl. .................. 324/537; 324/763; 324/765; 326/16; 714/731
(58) Field of Search .................. 324/537, 765, 324/158.1, 76.11, 763; 371/221; 714/721, 724, 731, 732, 733, 734, 735, 815; 713/500; 326/16, 93; 327/153, 141

(56) References Cited
U.S. PATENT DOCUMENTS

| | | | | |
|---|---|---|---|---|
| 4,862,071 A | * | 8/1989 | Sato et al. .................. 324/73.1 |
| 5,225,775 A | * | 7/1993 | Sekino .................. 324/158.1 |
| 5,231,314 A | * | 7/1993 | Andrews .................. 327/153 |
| 5,457,719 A | * | 10/1995 | Guo et al. .................. 375/373 |
| 5,471,152 A | * | 11/1995 | Gheewala et al. .................. 324/758 |
| 5,488,309 A | * | 1/1996 | Farwell .................. 324/617 |
| 5,583,430 A | * | 12/1996 | Dinteman .................. 324/158.1 |
| 5,619,148 A | * | 4/1997 | Guo .................. 327/3 |
| 5,621,739 A | * | 4/1997 | Sine et al. .................. 371/22.1 |

* cited by examiner

Primary Examiner—Anjan K. Deb
(74) Attorney, Agent, or Firm—Cynthia T. Faatz

(57) ABSTRACT

An output-relative signal receiver to test an integrated circuit that provides an output-relative data signal. The output-relative signal receiver receives the output-relative data signal and a corresponding output strobe signal from an integrated circuit device and produces a test strobe signal derived from the output strobe signal. The test strobe signal is used to test a feature of the integrated circuit device indicated by the output-relative data signal.

28 Claims, 6 Drawing Sheets

METHOD AND APPARATUS FOR TESTING AN INTEGRATED CIRCUIT HAVING AN OUTPUT-TO-OUTPUT RELATIVE SIGNAL

BACKGROUND

1. Field

An embodiment of the present invention relates to the field of integrated circuit testing and, more particularly, to testing of integrated circuits that provide one or more output-to-output relative signals.

2. Discussion of Related Art

The features and capabilities of integrated circuit testers can be important in determining the quality of the integrated circuits tested and can have a significant impact on their cost of manufacturing. A tester that is not capable of testing particular integrated circuit features may pass integrated circuit devices that do not operate properly, while a tester that does not provide an acceptable accuracy level may fail integrated circuit devices that perform as intended.

Source synchronous bus signaling techniques are being used more widely in recent years. In a source synchronous bus transaction, a transmitting device provides an output bus data signal along with an output strobe signal. A receiving device uses the output strobe signal to latch the bus data. Thus, source synchronous bus signaling falls under the general classification of output-relative, or output-to-output, timing specifications in which the timing of one or more output signals is specified relative to one or more different output signals.

Many currently available testers for very large scale integration (VLSI) circuits include timing systems that are based on a master clock within the tester. All timing edges driven to a device under test (DUT) and the timing of output compare signals within the tester are programmed relative to the tester's internal time base. For this reason, prior testers are not able to natively receive and test source synchronous signals.

To address this issue, one approach has been to perform a programmatic, iterative timing edge search for the source synchronous strobe signal from a DUT. Tester compare timings that are used to observe bus signals may then be recalculated based on the detected strobe edge. In this approach, once a strobe placement is determined, the same strobe placement is used for each subsequent bus cycle.

This process, however, is time consuming and, thus, expensive, such that it may not be viable for use in high volume manufacturing. Further, the above approach does not take into account the fact that strobe timing may vary with each bus cycle. Where the compare timing for the bus signals is set relative to an assumed fixed strobe timing, certain bus specifications may be tested too loosely or too tightly.

Further, as bus speeds continue to increase, the variation on bus output timing and limitations on tester edge placement accuracy will make it increasingly difficult to find any particular "sweet spot" at which to place a tester strobe to observe a DUT's source synchronous output response. Additionally, the tester strobe signal's edge placement accuracy becomes a larger portion of the bus cycle time such that it may become difficult to test certain timing specifications without producing an excessive number of false failures (i.e. yield loss).

In some cases, due to the above issues, cost reduction pressures may lead to eliminating testing of source synchronous or other output-relative AC timing specifications. Where such testing is not performed, however, the quality of integrated circuits may be compromised because integrated circuits that do not meet these timing specifications may not be identified during testing.

Thus, it is desirable to have an approach to testing source synchronous and other output-to-output relative output signals that may be more viable for high volume manufacturing.

SUMMARY OF THE INVENTION

A method and apparatus for testing an integrated circuit having an output-to-output relative signal are described.

In accordance with one embodiment, an apparatus for testing an integrated circuit comprises an output-relative signal receiver to receive an output-relative data signal and a corresponding output strobe signal from an integrated circuit device. The output-relative signal receiver is to produce a test strobe signal derived from the output strobe signal wherein the test strobe signal is to be used to test a feature of the integrated circuit device indicated by the output-relative data signal.

Other features and advantages of the present invention will be appreciated from the accompanying drawings and from the detailed description that follows below.

BRIEF DESCRIPTION OF THE DRAWINGS

The present invention is illustrated by way of example and not limitation in the figures of the accompanying drawings in which like references indicate similar elements, and in which.

DETAILED DESCRIPTION

A method and apparatus for testing an integrated circuit having a source synchronous output signal are described. In the following description, particular types of integrated circuits, test systems, circuit blocks and signals are described for purposes of illustration. It will be appreciated, however, that other embodiments are applicable to other types of integrated circuits and signals and to test systems configured in another manner.

In accordance with one embodiment, a tester captures source synchronous or other output-relative output data from a device under test (DUT) using a test strobe signal derived from the DUT's own strobe signal. This is in contrast to prior testers that use an internally generated strobe signal to capture output-relative data signals as described above.

Figure 1:
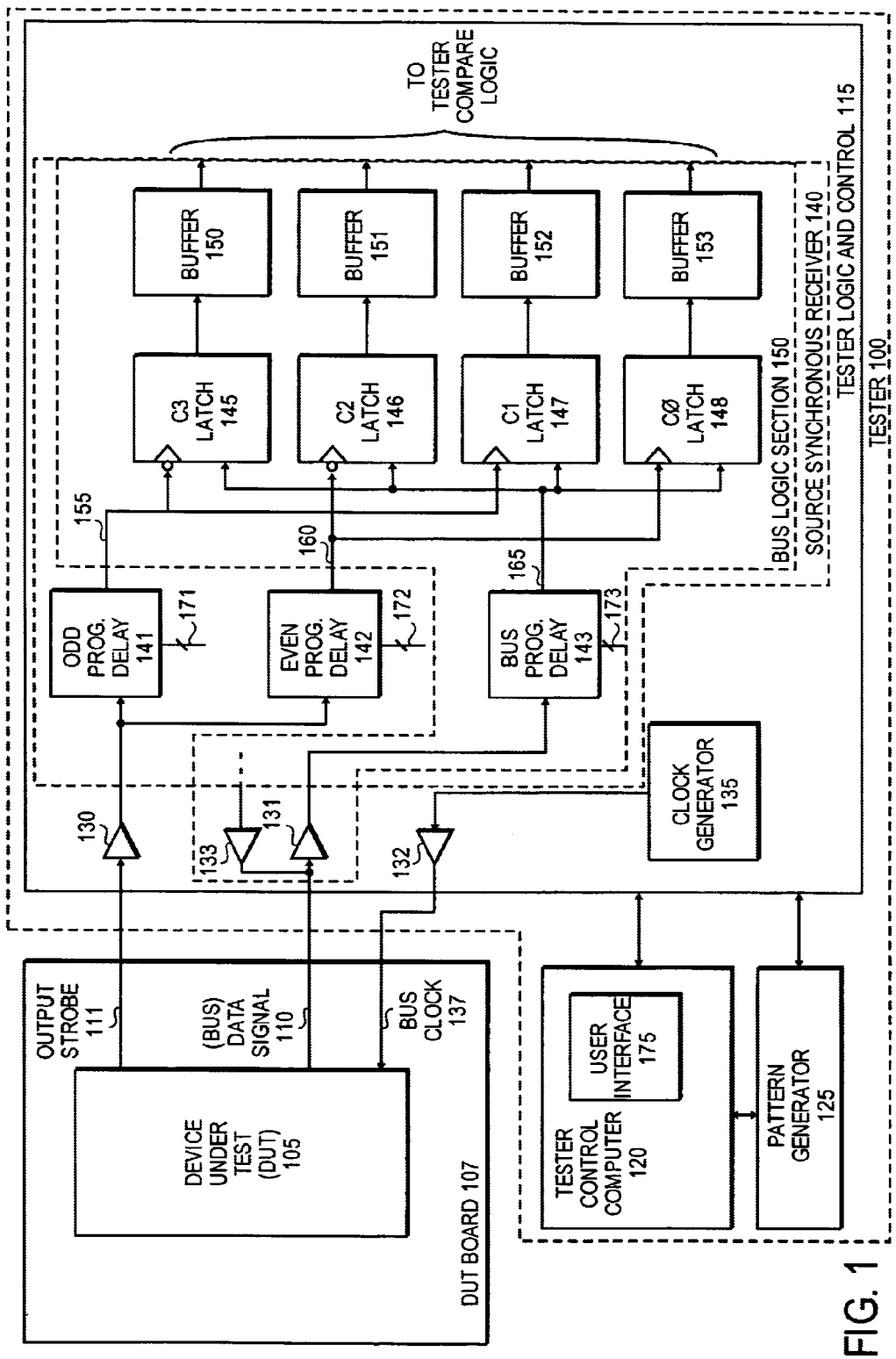
FIG. 1 is a block diagram showing a tester including an output-relative signal receiver of one embodiment.

FIG. 1 is a block diagram of an integrated circuit device tester 100 of one embodiment coupled to test a device 105, referred to herein as a device under test (DUT). The DUT 105 may be coupled to the tester 100 by a DUT board 107 or another type of interface that enables communication of signals between the tester 100 and the DUT 105. The DUT 105 provides at least one source synchronous or other type of output-to-output relative signal on a signal line 110 and a corresponding output strobe signal on an output strobe signal line 111. The output strobe signal 111 indicates to a receiving device when to latch the data provided by the output signal 110. In the description that follows, reference numbers for signal lines in FIG. 1 may also be used to indicate the corresponding signals transmitted over the lines.

The tester 100 includes a tester logic and control block 115 that is coupled to a tester control computer 120 and a pattern generator 125. The tester control computer may be a general-purpose control computer such as a SPARC™ workstation from Sun Microsystems, Inc. of Palo Alto, Calif. (SPARC is a trademark of Sun Microsystems, Inc.) Other types of control computers may also be used for other embodiments. The pattern generator 125 is provided to generate and control test patterns depending on the particular tests being run.

The tester logic and control block 115 of one embodiment includes pin electronics devices 130–133, a clock generator 135, an output-relative signal receiver 140 and other logic, including tester compare logic (not shown).

The pin electronics devices 130–133 include circuitry to supply signals to and receive signals from a DUT such as the DUT 105. While exemplary pin electronics devices 130–133 are shown in FIG. 1, it will be appreciated that the tester 100 may include any number of pin electronics devices corresponding to any number of tester input and/or output signals.

The clock generator 135 is provided to produce a clock signal on a clock signal line 137 that may be used to drive the DUT 105 during testing as described in more detail below.

The output-relative signal receiver 140 of one embodiment includes odd and even strobe programmable delay elements 141 and 142, a bus programmable delay element 143, clocked latches 145–148, referred to herein as chunk latches, and corresponding first in, first out (FIFO) buffers 150–153. The output-relative signal receiver 140 of the embodiment shown in FIG. 1 is coupled in the tester compare channel path between the tester pin electronics devices 130–132 and tester compare logic (not shown). By coupling the output-relative signal receiver 140 in this manner, for embodiments in which a source synchronous or other output-relative signal to be tested is a bidirectional signal, the tester's normal pin electronics drivers, such as the driver 133, are available to drive the DUT 105 when needed. Thus, the electrical environment between the DUT 105 and the tester 100 may remain a reasonably high quality, point-to-point transmission line.

The programmable delay elements 141–143 are coupled between the pin electronics receiver devices 130–132 and the chunk latches 145–148 as shown in FIG. 1. The delay provided by each of the delay elements 141–143 is programmable and may be adjusted depending on the particular timing specifications being tested as described in more detail below.

For one embodiment, each of the delay elements 141–143 includes one or more inputs 171–173, respectively, through which the delay of the corresponding element is programmed. For example, each delay element 141–143 may include 8 input lines 171–173 such that 256 steps of delay may be programmed into each of the delay elements 141–143. Each of the inputs or groups of inputs 171–173 may be coupled such that they are programmable by the tester control computer 120 through a user interface 175. Other numbers of input lines may be used for other embodiments to provide coarser or finer levels of control over the delay elements. Further, for other embodiments, other approaches to programming or otherwise adjusting the programmable delay elements 141–143 may be used.

For the embodiment illustrated in FIG. 1, the source synchronous output signal on the data signal line 110 from the DUT 105 is a bus data signal. The bus data signal line 110 may be part of a data bus or an address bus, for example. For this example, the bus that includes the bus signal line 110 is a quad-pumped bus (i.e. a bus that provides four "chunks" of data for each DUT strobe signal). The four data chunks are referred to in this example as C0, C1, C2 and C3. The corresponding labels in FIG. 1 indicate the particular data chunk to be latched by each of the latches 145–148 for any particular strobe cycle. By effectively time dividing the bus into separate signals (indicated by the chunks C0 . . . C3) in the above manner, the tester 100 may operate at a lower speed than the bus that includes the bus data signal 110.

Further, for this example, the bus may be partitioned into different sections, each with its own strobe signal. For one embodiment, for example, the bus that includes the bus data signal line 110 is a 64-bit bus that is partitioned into four 16-bit sections where a separate strobe signal is associated with each of the four sections.

For other embodiments, other types of source synchronous or output 20 relative signals, including other types of buses, may be tested using the output-relative signal receiver of one embodiment. For such embodiments, a different number of chunk latches and/or buffers may be used. Further, while four chunk latches 145–148 and four FIFO buffers 150–153 are included in the output-relative signal receiver 140 of FIG. 1 for convenience in testing the quad-pumped bus, a different number of chunk latches and/or buffers may also be used to test a quad-pumped bus in other embodiments. Where a different number of chunk latches and/or buffers are used, a different number of strobe delay elements may also be used to provide for proper latching of a corresponding output-relative data signal.

Because the bus data signal line 110 is part of a multi-bit bus in this example, it will be appreciated that the DUT 105 may include other similar data signal lines 110 for each bit of the bus. To test the other bus signal lines 110, a bus logic section 150 of the output-relative signal receiver 140 may be replicated within the tester 100 for each of the bus signal lines 110. Where the bus is partitioned, as mentioned above, the odd and even programmable delay elements 141 and 142 are also replicated for each different strobe signal.

Figure 5:
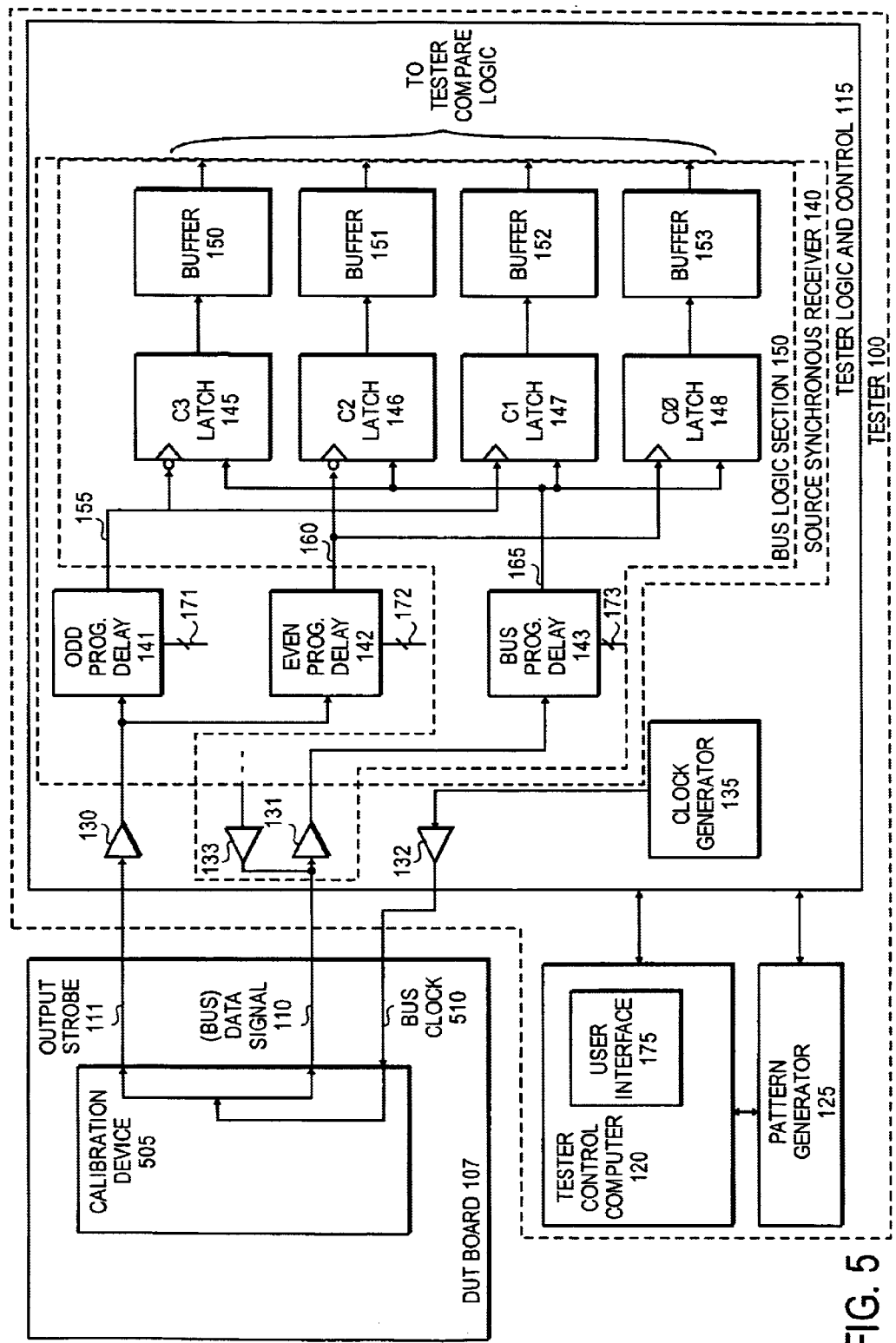
FIG. 5 is a block diagram showing the tester and output-relative signal receiver of FIG. 1 during a calibration operation.

For one embodiment, prior to testing the DUT 105, a calibration operation may be performed to identify the appropriate delay for each of the bus programmable delay elements 143 (and others not shown) in order to achieve zero setup and zero hold time at the chunk latches 145–148. The calibration operation involves decoupling the DUT 105 from the tester 100 by removing the DUT 105 from a DUT board 107 socket, for example. In some cases, as shown in FIG. 5, the DUT 105 may be replaced in the DUT board 107 by a special device 505, referred to as a calibration device, that effectively wires the output strobe signal line 111 and all of the bus signal lines 110 together.

A calibration clock signal 510 provided by, for example, the clock generator 135, is then used to drive the calibration device 505 to produce a master signal at outputs of the calibration device. The master signal is in the form of a pulse that is fired for each calibration adjustment. This master signal is fed into the strobe signal input 130 of the tester 100, and individually and iteratively into each bus signal input 131 (and others not shown) as described below.

Figure 6:
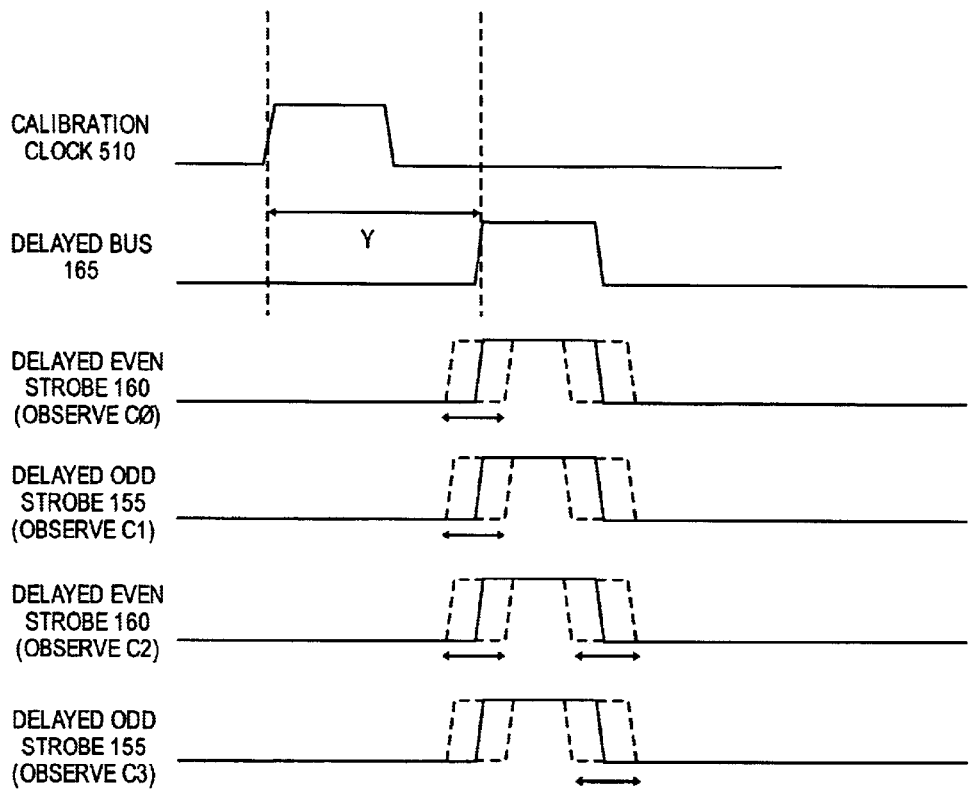
FIG. 6 is a timing diagram showing exemplary signals for zero setup and hold calibration searches using the tester and output-relative signal receiver of FIG. 5.

For purposes of example, the calibration procedure of one embodiment is described with reference to the bus signal line 110. Referring to FIGS. 5 and 6, during calibration, the bus programmable delay element 143 is set to provide some arbitrary, mid-range delay value Y. In this manner, a rising edge of the delayed bus signal 165 is separated from a rising edge of the calibration clock signal (and thus, the bus data signal 110) by Y.

For a first calibration pass, the even programmable delay element 142 is adjusted to find the minimum setup time relative to the time Y for the c0 chunk latch 148. For one embodiment, this is accomplished by observing only the data value captured in the c0 latch 148. The minimum delay from the time Y at which a logic 1 is captured by the c0 latch 148 is the minimum setup time corresponding to the c0 latch 148. It will be appreciated that adjustment of the even programmable delay element 142 to identify the minimum setup time corresponding to the c0 latch 148 may involve multiple calibration clock 510 cycles.

FIG. 6 shows exemplary timing diagrams for the calibration clock 510, delayed bus 165 and delayed even strobe 160 signals that may be used to identify the minimum setup time corresponding to the c0 latch 148. The horizontal arrow under the delayed even strobe signal 160 (for observing c0) identifies the edge of interest for the above calibration pass while the dotted lines indicate adjustment of the signal to determine the minimum setup time.

For a second calibration pass, the odd programmable delay element 141 is adjusted in a similar manner to find the minimum setup time relative to the time Y for the c1 chunk latch 147. For one embodiment, the minimum delay from the time Y at which a logic 1 is captured by the c1 latch 147, while only the c1 latch 147 is being observed, is the minimum setup time corresponding to the c1 latch 147.

Third and fourth calibration passes are performed in a similar manner to identify minimum setup times corresponding to the c2 and c3 chunk latches 146 and 145, respectively. The delayed even and odd strobe signals 160 and 155, however, are inverted at inputs to the c2 and c3 chunk latches 146 and 145 as shown in FIG. 1. Thus, for the third and fourth calibration passes, the minimum setup times corresponding to each of the c2 and c3 chunk latches 146 and 145 are equal to the respective minimum delays from the time Y at which a logical 0 is captured by each of the latches. As shown in FIG. 6, the edges of interest for the third and fourth calibration passes are the trailing edges of the respective delayed strobe signal. The largest of the four observed minimum setup time offsets from the delay Y is considered to be the minimum setup time offset, also referred to as the zero setup time offset, associated with the bus programmable delay element 143 for the corresponding tester channel.

Minimum hold timings corresponding to each of the c0–c3 chunk latches 148–145 are determined in a similar manner. The observed values in each of the chunk latches to determine minimum hold timings, however, are complementary to the values observed to determine minimum setup timings as indicated in FIG. 6. The largest of the four observed minimum hold time offsets from the calibration delay Y is considered to be the minimum hold time offset, also referred to as the zero hold time offset, corresponding to the bus programmable delay element 143 and corresponding tester channel.

The above-described process is repeated for each of the other data signal lines 110 (not shown) to identify minimum setup and hold time offsets corresponding to each of the other data signal lines. It will be appreciated that the minimum setup and hold time offsets may each be different for each of the bus programmable delay elements 143. The minimum setup and hold time offsets corresponding to each of the bus programmable delay elements 143 (only one of which is shown) may be stored in a memory (not shown) in the tester 100. The minimum setup and hold time offsets may be used when setting the delay of the bus programmable delay components 143 for testing purposes as described in more detail below.

For other embodiments, the strobe signal even and odd delay elements may be replicated for each bus signal receiver channel. Alternatively, or additionally, instead of providing even and odd programmable delay elements, there may be a strobe delay element per chunk latch. For any of these embodiments, a calibration operation may be performed in a similar manner to that described above.

The above-described calibration procedure may be performed, along with other per-setup calibration operations such as load board channel length measurements, each time the test fixturing is set up (i.e. each time the DUT board 107 is coupled to the tester 100). The calibration frequency may further depend on the particular tester 100 configuration and operation as well as the desired manufacturing tolerances.

Figure 2:
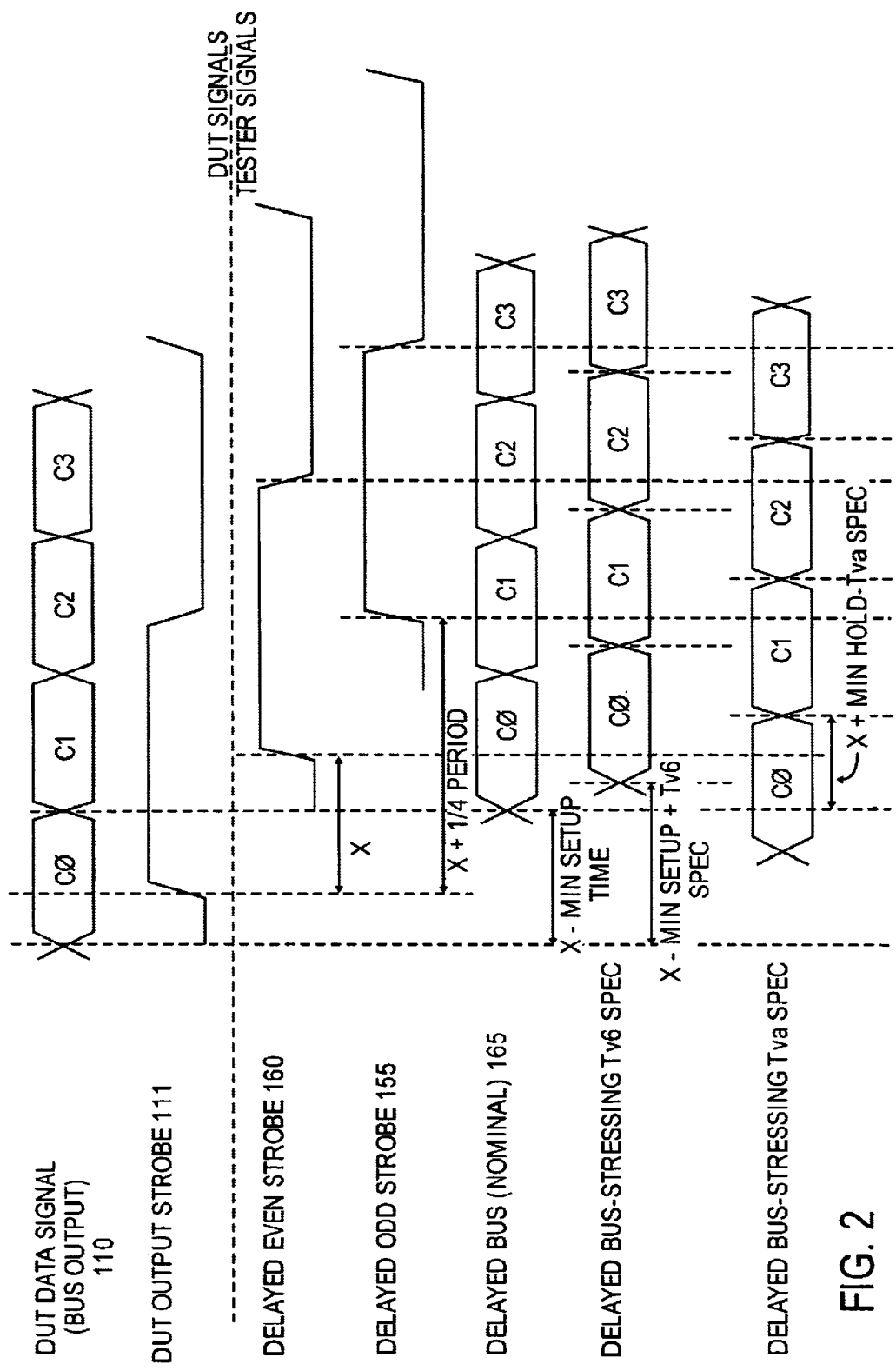
FIG. 2 is a timing diagram showing exemplary bus and tester timings for the device under test and tester of FIG. 1.

Once the tester 100 is calibrated, functionality and/or timings of the DUT 105 (either of which may be referred to herein as a DUT feature or specification) may be tested. To test features that may be observed via the DUT 105 bus including the bus signal line 110, the even strobe programmable delay element 142 is programmed to provide an arbitrary delay X. For the example of FIG. 1 in which the bus data signal 110 is a quad-pumped signal, the odd strobe programmable delay element 141 is programmed to provide a delay of X plus ¼ of the output strobe 111 period. During testing, for one embodiment, the period of the output strobe 111 signal is known by the tester 100 because the output strobe signal 111 is derived from the bus clock signal 137 which is provided by the tester clock generator 135. Thus, it is straightforward to determine the additional delay to be added to the delay X to arrive at a delay equal to X plus ¼ of the output strobe 111 period for the odd strobe programmable delay element 141. Once the odd and even strobe programmable delay elements 141 and 142 have been programmed in the above manner, the result is two 90-degree phase-shifted strobe signals 155 and 160 delayed by an arbitrary amount of time X as shown in FIG. 2. These delayed strobe signals 155 and 160 may alternately be referred to herein as test strobe signals because they are used by the tester 100 to measure timings associated with the DUT 105 bus data signals 110.

Each of the bus programmable delay elements 143 is programmed to provide the same arbitrary delay X adjusted for the particular zero setup time offset determined for the tester channel associated with the corresponding bus signal line 110 during the calibration operation. Adjusting the delay for each of the bus programmable delay elements 143 by this zero setup time offset effectively nulls out time error factors associated with the different tester channels used to test each of the bus signal lines 110. In this manner, the resultant waveforms for the delayed even strobe signal 160 and the delayed bus signal 165 have an equivalent phase relationship to the DUT output strobe signal 111 and the bus data signal 110 as they are provided at DUT 105 outputs. Further, the delayed odd strobe signal 155 is generated at the proper time relative to these signals to latch the C1 and C3 data chunks. Exemplary waveforms illustrating the relationship between the various signals are shown in FIG. 2.

Once the delay of each of the delay elements 141–143 is set, testing of the DUT 105 may proceed. The tester 100 may stimulate the DUT 105 at various inputs to the DUT 105 (not shown) using patterns provided by the pattern generator 125. Corresponding output data from the DUT 105 can then be latched and compared to expected data to determine whether the DUT 105. operates properly as described in more detail below.

During testing of the DUT 105, the tester 100 may drive the DUT bus clock signal 137 using the clock generator 135. As the DUT 105 is stimulated by the tester 100, the resulting bus data output signal(s) 110 is received by the tester 100 at the corresponding pin electronics receiver 131 and the output strobe signal 111 is received at the pin electronics receiver 130.

The delayed bus signal(s) 165 (delayed by delay element(s) 143) is received at a data input of each of the chunk latches 145–148. The chunk latch 148 latches data at its input on a rising edge of the delayed even strobe signal 160, while the chunk latch 147 latches data at its input on a rising edge of the delayed odd strobe signal 155. Similarly, the chunk latch 146 latches data at its input on a falling edges of the delayed even strobe signal 160 while the chunk latch 145 latches data at its input on a falling edge of the delayed odd strobe signal 155. Assuming the delays of the programmable delay elements 141–143 have been set appropriately, and the DUT 105 is operating properly, latch 148 should latch chunk C0, latch 147 should latch chunk C1, latch 146 should latch chunk C2 and latch 145 should latch chunk C3 of quad-pumped data, indicated by the bus data signal 110.

Once data has been latched by the chunk latches 145–148, it is provided to corresponding buffers 150–153 for evaluation by subsequent tester compare logic (not shown). The tester compare logic may, for example, compare the latched data to expected data stored in a memory of the tester 100 (not shown). If the latched data does not match the expected data, the DUT 105 may be determined to fail the particular test being performed, for example. Alternatively, if the latched data matches the expected data, the DUT 105 may be identified as passing the particular specification being tested.

Use of the buffers 150–153 frees up the chunk latches 145–148 to receive data in the next bus cycle. In this manner, looser timings may be used for compare operations performed by tester 100 compare logic to test functionality of the DUT 105 because all latched data remains valid for the entire bus cycle.

For some embodiments, additional buffers may be used to add buffer depth such that even looser compare timing may be used depending on the constraints of the tester 100. For other embodiments, the buffers 150–153 may not be included if the tester compare logic is able to compare the latched data to expected data before the chunk latches 145–148 are to latch data during a next bus cycle.

Some timing specifications associated with the DUT 105 bus that includes the data bus signal line(s) 110 may be tested by further manipulation of delays provided by the bus delay element 143. A Time Valid Before ($t_{VB}$) timing specification, for example, may be tested by programming the bus programmable delay element to X plus the $t_{VB}$ specification value and adjusting this delay for the zero setup time value corresponding to each of the bus lines. In this manner, if each of the data chunks C0 . . . C3 is produced by the DUT 105 with greater than the $t_{VB}$ specification before the corresponding strobe transition, then the chunk latches 145–148 will capture the proper data values. If the $t_{VB}$ specification is not met for any of the data chunks, incorrect data may be latched. An exemplary waveform showing the manner in which the $t_{VB}$ spec may be tested is shown in FIG. 2.

For purposes of illustration, if the period of each data chunk is 1.25 ns, the $t_{VB}$ spec is 200 ps minimum, the zero (minimum) setup time for the particular bus signal line is 125 ps and X is selected to be 2 ns, the bus delay for loose testing of the bus will be X− zero setup=2 ns−125 ps=1.875 ns. For this example, the actual performance margin to the $t_{vb}$ spec is assumed to be tighter than the actual performance margin to the Time Valid After ($t_{va}$) spec. (For loose testing, to ensure that there are no $t_{VB}$-related failures, the alignment between the, data and strobe signals is adjusted by the known zero setup time for the particular chunk latch. By adjusting the bus line delay value in this manner, that data hold time ($t_{va}$) may be inadvertently stressed.)

For testing of the $t_{vb}$ spec, the bus delay will be X−zero setup+$t_{vb}$ spec=2 ns−125 ps+200 ps=2.075 ps, for this example. The $t_{vb}$ actual specification may be characterized for each channel and each chunk by observing only the one channel and chunk of interest while masking compare operations on all others. This is done while varying the bus signal delay and using the zero setup time factor for the particular chunk latch being evaluated. If the $t_{vb}$ actual for the above example is determined to be 350 ps for a particular chunk, then it is determined that the margin is $t_{vb}$ actual−$t_{vb}$ minimum=350 ps−200ps=150 ps. It will be appreciated that the values for the delays and specifications provided above are for purposes of example only.

The $t_{VA}$ specification associated with the output-relative DUT 105 bus may also be tested by the tester 100. To test the $t_{VA}$ specification, the bus programmable delay elements 143 are programmed to provide a delay of X minus the $t_{VA}$ specification value adjusted for the zero hold time value corresponding to each of the bus lines 110. The DUT 105 is determined to meet the $t_{VA}$ specification if each chunk of data is latched by the corresponding chunk latch. 145, 146, 147 or 148 before the next chunk of data is available. An exemplary waveform that may be used to test the $t_{VA}$ specification is shown in FIG. 2. Other output-relative specifications associated with the DUT 105 may be tested by the tester 100 in a similar manner by manipulating the delays provided by one or more of the programmable delay elements 141–143.

Figure 3:
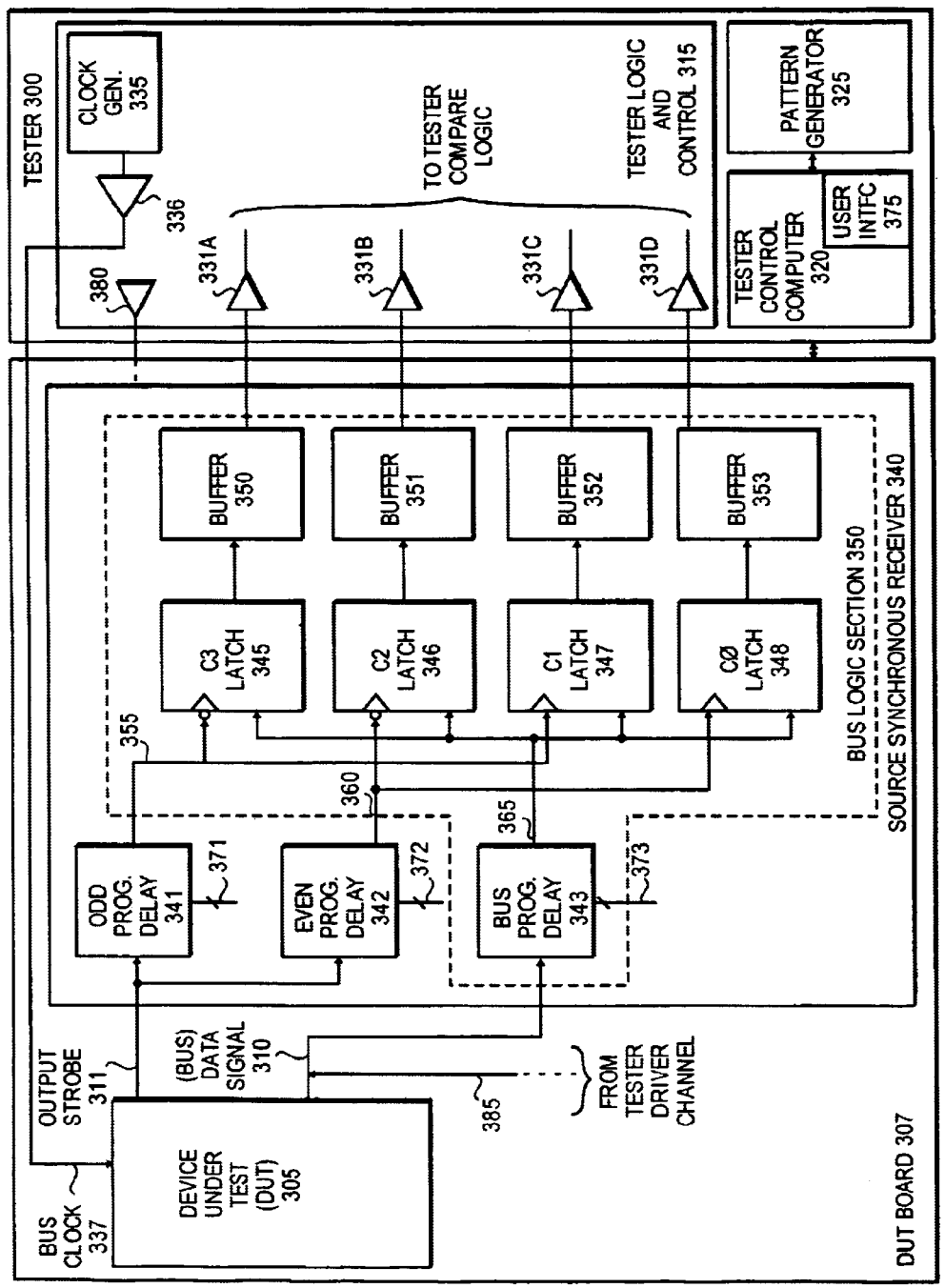
FIG. 3 is a block diagram showing an output-relative signal receiver of an alternate embodiment.

FIG. 3 is a block diagram showing an output-relative signal receiver 340 of another embodiment. In the embodiment of FIG. 3, the output-relative signal receiver 340 is located between a DUT 305 and the pin electronics of an integrated circuit tester 300. The integrated circuit tester 300 includes tester logic and control 315, a tester control computer 320 which may be a general purpose workstation such as a SPARC workstation from Sun Microsystems, Inc., and a pattern generator 325. The integrated circuit tester 300 may be an ITS 9000GX logic tester from Schlumberger Corporation of San Jose, Calif., for example. Other types of testers may also be used for other embodiments.

For one embodiment, the output-relative signal receiver 340 is fabricated in silicon and may be located on a DUT board 307 or other DUT-to-tester interface. The output-relative signal receiver 340 of one embodiment includes programmable delay elements 341–343 similar to programmable delay elements 141–143 of FIG. 1. Where a data signal 310 to be tested is part of a bus as in the example of FIG. 3, a bus logic section 350 of the output-relative signal receiver 340 may be replicated for each bit of the bus that includes the bus data signal 310.

The programmable delay elements 341–343 may be programmed via one or more programmable inputs 371–373 to provide desired delays at each of the delay elements 341–341 as described above in reference to the embodiment of FIG. 1. For one embodiment, the programmable delay elements 341–343 are programmed via a user interface 375 of the tester control computer 320 in a similar manner to the programmable delay elements 141–143 of FIG. 1. To provide this programmability, one or more additional signal paths (e.g. through the use of one or more additional tester channels, for example)-between the tester 300 and the output-relative signal receiver 340 may be provided along with a data bus (not shown) from the control computer 320 to the delay elements 341–343.

The programmable delay elements 341–343 may also be calibrated in the manner described above to determine zero setup time and zero hold time offsets for each of the bus programmable delay elements 343 corresponding to each of the data signal lines 310 (only one of which is shown in FIG. 3).

The output-relative signal receiver 340 of one embodiment also includes four latches 345–348 and four corresponding buffers 350–353 similar to the latches 145–148 and buffers 150–153 of FIG. 1. For the example shown in FIG. 3, four latches are used for convenience in testing a DUT, such as the DUT 305, that provides a quad-pumped output bus including the bus data signal line 310. For other embodiments, and/or for testing other types of output-relative signals, a different number of latches, buffers and/or delay elements may be used. The particular number of latches, buffers and/or delay elements may be determined by the test designer by balancing issues such as the number of tester channels to be used, tester speed, the type of signal(s) to be tested, etc.

During testing of the DUT 305, a clock generator 335 and corresponding clock driver buffer 336 on the tester 300 may provide a bus clock signal 337 to the DUT 305. The bus clock signal 337, for this example, determines the period of a DUT output strobe signal 311 that is provided by the DUT 305 along with the data signal(s) 310. The output strobe signal 311 from the DUT 305 is received by the output-relative signal receiver 340 at the odd and even strobe programmable delay elements 341 and 342. A delayed odd strobe signal 355 is provided at clock inputs of the latches 345 and 347 while a delayed even strobe signal 360 is provided at clock inputs of the latches 346 and 348 as described above.

Concurrently, the bus data signal 310 is received at the output-relative signal receiver by the bus programmable delay element 343. A delayed bus signal 365 is provided at data inputs of the latches 345–348 as shown. The latches 345–348 latch data at their respective data inputs in the manner described above in reference to FIG. 1. The latched data is transferred to corresponding buffers 350–353 and then to the tester 300 compare logic (not shown) via corresponding tester pin electronics receivers 331A–331D. The compare logic compares the received data with expected data that may be stored in a memory of the tester (not shown), for example.

Testing of particular bus timing specifications such as $t_{VA}$ and $t_{VB}$ may be performed in a manner similar to that described above for the embodiment of FIG. 1.

Where the DUT bus, or other output-relative signal to be tested is a bidirectional signal, a "fly-by" topology may be used. In a fly-by topology, separate drive and compare transmission line paths may be used for one signal line or pin of the DUT 305. This can be accomplished, for example, by using an additional tester channel. For example, for the bus data signal 310, the tester pin electronics receivers 331A–331D receive data from the bus data signal line 310 while a separate pin electronics driver 380 may be used to drive the bus data signal over a signal line 385. Where such a fly-by topology is used, additional consideration may be given to maintaining signal integrity and test effectiveness due to the change in load impedance seen by the DUT as a result of using an additional tester channel.

While the above-described embodiments refer to integrated circuit devices providing a single-ended strobe signal, integrated circuit devices that provide a differential strobe signal may also be tested in a similar manner. For such embodiments, a differential amplifier per differential strobe signal may precede the output-relative signal receivers described above.

In accordance with the above-described embodiments, an integrated circuit tester may be able to natively receive and test source synchronous signals.

Some embodiments of the invention enable reliable observation of source synchronous DUT output signals even where signals vary in time from bus cycle to bus cycle. This is possible because the test strobe signal(s) used to observe the source synchronous DUT output signals is derived directly from the DUT output strobe and not solely from the tester internal timing base. In this manner, any variations in the DUT output strobe timing from bus cycle to bus cycle will also be reflected in the test strobe timing.

Further, because a high rate bus may be time divided into separate signals (i.e. data may be separated into chunks) for some embodiments, a tester that operates at a fraction of the bus rate to be tested may be used. This feature enables an economic tradeoff between maximum tester cycle rate needed versus tester resources (i.e. number of tester channels and corresponding timing generators, data memory, formatters, etc.) to handle the time divided signals. Typically, the higher the tester cycle rate, the more expensive the tester.

The buffers of some embodiments may also provide for the tester to use looser timing accuracy without compromising the quality of integrated circuit device testing. The buffers may provide additional time for tester compare logic to determine whether latched data matches expected data.

The output-relative signal receiver of some embodiments is also scalable to provide for testing of different kinds of output-relative signals and/or to provide for different DUT pin-to-tester channel expansion ratios. While a quad-pumped bus has been described above, the output-relative signal receiver may include a different number of chunk latches and/or buffers for double-pumped or single-pumped buses or other types of output-relative signals, for example. Further, the DUT pin-to-tester channel expansion ratio for testing a particular type of output-relative signal may be determined by the test designer and may involve tradeoffs between the cost of higher tester cycle rates versus higher tester channel count and lower tester vector memory depth.

Figure 4:
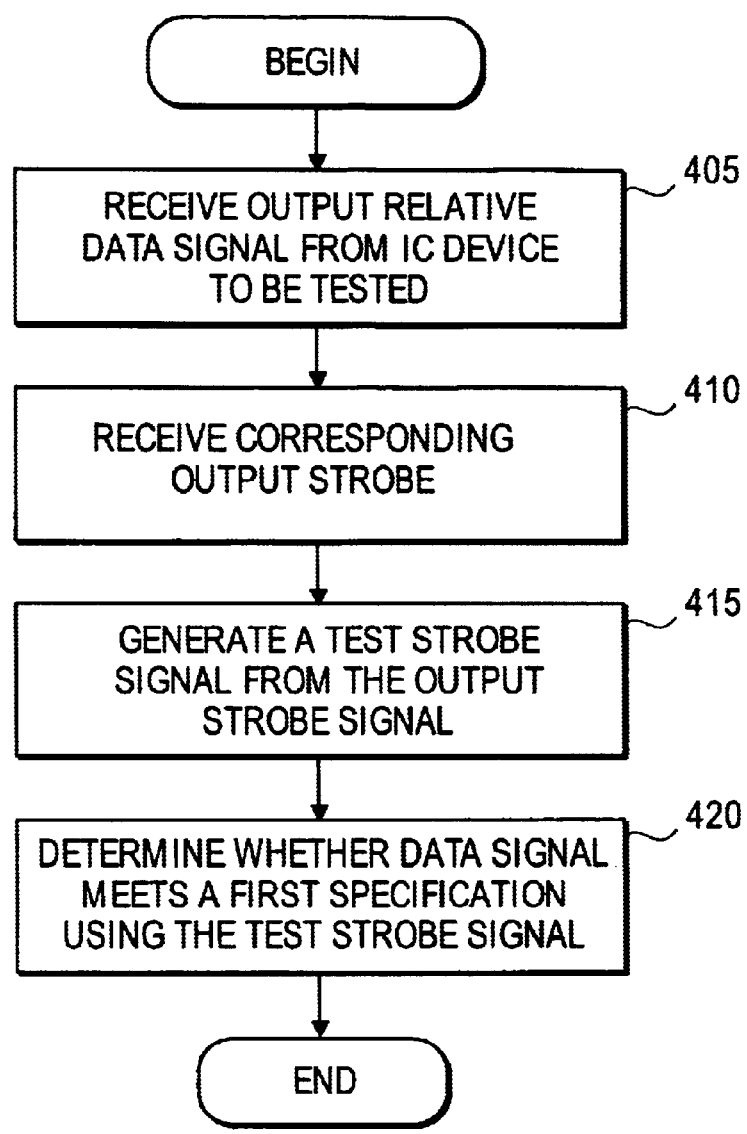
FIG. 4 is a flow diagram showing a method of one embodiment for testing an integrated circuit device that provides an output-relative signal.

FIG. 4 is a flow diagram showing a method for testing an integrated circuit output-relative signal in accordance with one embodiment. At block 405, an output-relative data signal is received from an integrated circuit device to be tested and at block 410, a corresponding strobe signal is received. A test strobe signal is generated from the output strobe signal at block 415 and at block 420, it is determined whether the data signal meets a first specification using the test strobe signal.

Additional actions such as latching the data signal using the test strobe signal, comparing the latched data with expected data, programming programmable delay elements to adjust the relationship between a delayed output-relative data signal and a delayed output strobe signal may also be included for various embodiments.

In the foregoing specification, the invention has been described with reference to specific exemplary embodiments thereof. It will, however, be appreciated that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An apparatus for testing an integrated circuit, the apparatus comprising:

an output-relative signal receiver to receive an output-relative data signal and a corresponding output strobe signal from an integrated circuit device, the output-relative signal receiver to produce a test strobe signal derived from the output strobe signal, the test strobe signal to be used to test a feature of the integrated circuit device indicated by the output-relative data signal.

2. The apparatus of claim 1 wherein the output-relative signal receiver comprises:

a first strobe delay element to delay the output strobe signal by a first delay; and a bus delay element to delay the output-relative data signal by a second delay, the first strobe delay element and the bus delay element being adjustable to vary a relationship between the delayed output strobe signal and the delayed output-relative data signal to test each of a set of timing specifications.

3. The apparatus of claim 2 wherein the output-relative signal receiver further comprises:

a second strobe delay element to delay the output strobe signal by a third delay that is different from the first delay, the second strobe delay element being adjustable to vary a relationship between the output strobe signal delayed by the third delay and at least the delayed output-relative data signal.

4. The apparatus of claim 2 wherein the output-relative signal receiver further comprises:

a latch coupled to the first strobe delay element and the bus delay element, the latch to latch data indicated by the delayed output-relative data signal at a transition of the delayed strobe signal.

5. The apparatus of claim 2 wherein the output-relative data signal provides a plurality of chunks of data for each output strobe signal period and wherein the output-relative signal receiver further comprises:

a plurality of latches, each of the plurality of latches corresponding to one of the plurality of chunks of data for each output strobe signal period; and a plurality of buffers, at least one of the plurality of buffers being coupled to each of the plurality of latches, the buffers to buffer data between the plurality of latches and compare logic of the tester.

6. The apparatus of claim 5 wherein the output-relative data signal is a quad-pumped bus signal and wherein the output-relative signal receiver further comprises:

a second strobe delay element to delay the output strobe signal by a third delay that is different from the first delay, the second strobe delay element being adjustable to vary a relationship between the output strobe signal delayed by the third delay and at least the delayed output-relative data signal, the plurality of latches comprising four latches, a first set of the latches to latch data at a corresponding latch input in response to a transition of the output strobe signal delayed by the first delay, a second set of latches to latch data at a corresponding latch input in response to a transition of the output strobe signal delayed by the third delay.

7. The apparatus of claim 1 wherein the output-relative signal receiver is coupled within an integrated circuit tester between a receiver and tester compare logic.

8. The apparatus of claim 1 wherein the output-relative signal receiver is coupled between the integrated circuit device and an integrated circuit tester receiving device.

9. The apparatus of claim 8 wherein the output-relative data signal is a bidirectional signal and wherein the output-relative signal receiver is coupled such that a tester driving device bypasses the output-relative signal receiver when driving the output-relative data signal.

10. An integrated circuit tester comprising:

an output-relative signal receiver to receive an output-relative data signal and a corresponding output strobe signal from an integrated circuit device, the output-relative signal receiver to test a feature of the integrated circuit device indicated by the output-relative data signal using a test strobe signal derived from the output strobe signal.

11. The integrated circuit tester of claim 10 wherein the output-relative signal receiver comprises:

a first strobe delay element to delay the output strobe signal by a first delay; and a bus delay element to delay the output-relative data signal by a second delay, the first strobe delay element and the bus delay element being adjustable to vary a relationship between the delayed output strobe signal and the delayed output-relative data signal to test each of a set of timing specifications.

12. The integrated circuit tester of claim 11 wherein the output-relative signal receiver further comprises:

a second strobe delay element to delay the output strobe signal by a third delay that is different from the first delay, the second strobe delay element being adjustable to vary a relationship between the output strobe signal delayed by the third delay and at least the delayed output-relative data signal.

13. The integrated circuit tester of claim 12 wherein the first and second strobe delay elements and the bus delay element are programmable through a tester user interface.

14. The integrated circuit tester of claim 12 further comprising:

a clock generator, the clock generator to provide a bus clock signal to the integrated circuit device during testing, the bus clock signal to determine a period of the output strobe signal, wherein a relationship between the third delay and the first delay may be determined based on the period of the output strobe signal.

15. The integrated circuit tester of claim 11 wherein the output-relative signal receiver further comprises:

a latch coupled to the first strobe delay element and the bus delay element, the latch to latch data indicated by the delayed output-relative data signal at a transition of the delayed strobe signal.

16. The integrated circuit tester of claim 11 wherein the output-relative data signal provides a plurality of chunks of data for each output strobe signal period and wherein the output-relative signal receiver further comprises:
- a plurality of latches, each of the plurality of latches corresponding to one of the plurality of chunks of data for each output strobe signal period; and
- a plurality of buffers, at least one of the plurality of buffers being coupled to each of the plurality of latches, the buffers to buffer data between the plurality of latches and tester compare logic.

17. The integrated circuit tester of claim 16 wherein the output-relative data signal is a quad-pumped bus signal and wherein the output-relative signal receiver further comprises:
- a second strobe delay element to delay the output strobe signal by a third delay that is different from the first delay, the second strobe delay element being adjustable to vary a relationship between the output strobe signal delayed by the third delay and at least the delayed output-relative data signal,
- the plurality of latches comprising four latches, a first set of the latches to latch data at a corresponding latch input in response to a transition of the output strobe signal delayed by the first delay, a second set of latches to latch data at a corresponding latch input in response to a transition of the output strobe signal delayed by the third delay.

18. A method for testing an integrated circuit, the method comprising:
- receiving an output-relative data signal from an integrated circuit device;
- receiving an output strobe signal from the integrated circuit device corresponding to the output-relative data signal;
- generating a test strobe signal from the output strobe signal; and
- determining whether the output-relative data signal meets a first specification using the test strobe signal.

19. The method of claim 18 further comprising:
- delaying the output-relative data signal by a first delay; and
- delaying the output strobe signal by a second delay.

20. The method of claim 19 wherein delaying the output-relative data signal is performed using a first delay element.

21. The method of claim 20 further comprising:
- calibrating the first delay element to determine a zero setup time offset.

22. The method of claim 21 further comprising:
- testing a first specification of the output-relative data signal by adjusting the second delay by the zero setup time offset.

23. The method of claim 20 further comprising:
- calibrating the first delay element to determine a zero hold time offset.

24. The method of claim 23 further comprising:
- testing a second specification of the output-relative data signal by adjusting the second delay by the zero hold time offset.

25. The method of claim 20 further comprising:
- delaying the output strobe signal by a third delay using a second delay element; and
- determining a relationship between the first, second and third delays in response to a number of data chunks supplied by the output-relative data signal per output strobe signal period.

26. The method of claim 18 further comprising:
- latching data indicated by the output-relative data signal using the test strobe signal;
- buffering the latched data; and
- comparing the buffered data to expected data to determine whether the integrated circuit device passes or fails a specification.

27. A method comprising:
- natively receiving an integrated circuit device output-relative data signal and corresponding strobe signal at a tester; and
- natively testing a feature of the integrated circuit device indicated by the output-relative data signal using a tester strobe signal derived from the strobe signal.

28. The method of claim 27 wherein natively testing comprises:
- latching data indicated by the output-relative data signal in response to the tester strobe signal; and
- comparing the latched data to expected data to determine whether the integrated circuit device passes or fails a specification.

* * * * *

UNITED STATES PATENT AND TRADEMARK OFFICE
CERTIFICATE OF CORRECTION

PATENT NO. : 6,693,436 B1
DATED : February 17, 2004
INVENTOR(S) : Nelson

It is certified that error appears in the above-identified patent and that said Letters Patent is hereby corrected as shown below:

Column 4,
Line 30, after "output", delete "20".

Signed and Sealed this

Twenty-second Day of June, 2004

JON W. DUDAS
*Acting Director of the United States Patent and Trademark Office*